(12) United States Patent
Kraus et al.

(10) Patent No.: US 9,901,000 B2
(45) Date of Patent: Feb. 20, 2018

(54) MODULE ARRANGEMENT

(71) Applicant: Euchner GmbH & Co. KG, Leinfelden-Echterdingen (DE)

(72) Inventors: Matthias Kraus, Ostfildern (DE); Markus Hörtling, Leinfelden-Echterdingen (DE); Monika Schmid, Grossbettlingen (DE); Dominik Schmid, Grossbettlingen (DE); Timo Siefert, Leinfelden-Echterdingen (DE); Jens Rothenburg, Nürtingen (DE)

(73) Assignee: Euchner GmbH & Co. KG, Leinfelden-Echterdingen (DE)

( * ) Notice: Subject to any disclaimer, the term of this patent is extended or adjusted under 35 U.S.C. 154(b) by 0 days.

(21) Appl. No.: 15/222,990

(22) Filed: Jul. 29, 2016

(65) Prior Publication Data
US 2017/0042048 A1 Feb. 9, 2017

(30) Foreign Application Priority Data
Aug. 6, 2015 (DE) .......... 10 2015 112 990

(51) Int. Cl.
| H05K 7/00 | (2006.01) |
| H05K 5/02 | (2006.01) |
| F16P 3/08 | (2006.01) |
| H01H 27/00 | (2006.01) |
| G06N 99/00 | (2010.01) |
| H05K 5/00 | (2006.01) |
| H01H 11/00 | (2006.01) |

(52) U.S. Cl.
CPC .............. *H05K 5/0208* (2013.01); *F16P 3/08* (2013.01); *G06N 99/005* (2013.01); *H01H 11/0006* (2013.01); *H01H 27/00* (2013.01); *H05K 5/0021* (2013.01); *H01H 2011/0025* (2013.01)

(58) Field of Classification Search
CPC ....... H05K 5/0208; F16P 3/08; G06N 99/005; H01H 11/0006; H01H 27/00; H01H 2011/0025; H03K 17/945
USPC .................. 361/728–729, 825, 826
See application file for complete search history.

(56) References Cited

U.S. PATENT DOCUMENTS

| 6,036,505 | A  | * | 3/2000 | Zell ........................ H05K 1/145 439/74 |
| 9,019,718 | B2 | * | 4/2015 | Bdeir ..................... H01R 11/30 361/792 |
| 9,622,370 | B2 | * | 4/2017 | Gehrke ................... H05K 7/026 |
| 2003/0167850 | A1 | * | 9/2003 | Ishiguro .................. G01C 9/06 73/718 |
| 2015/0055305 | A1 | * | 2/2015 | Mackey ............ H01R 13/6683 361/733 |

* cited by examiner

*Primary Examiner* — Hung S Bui
(74) *Attorney, Agent, or Firm* — Michael Soderman

(57) ABSTRACT

The invention relates to a module arrangement (1) with a base module and at least one submodule (5); the base module has at least two connection modules. The submodule (5) can be put into contact via a connection module with a choice of one of the connection modules of the base module and can consequently be attached to the base module in different orientations. Detection devices for detecting the orientation of the submodule (5) attached to the base module are provided in the base module.

15 Claims, 3 Drawing Sheets

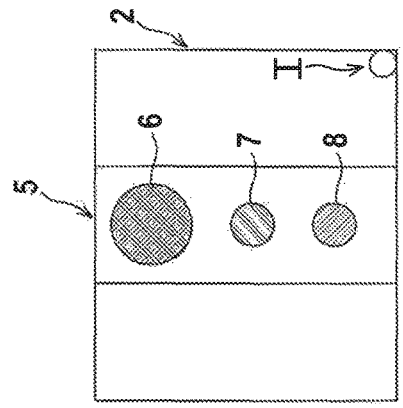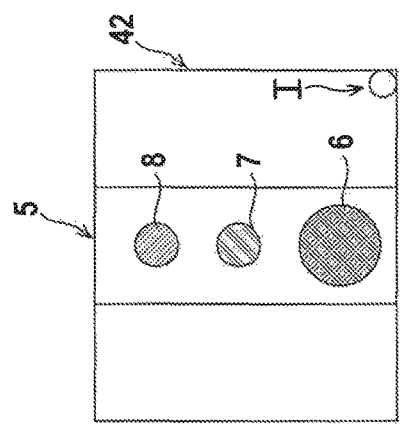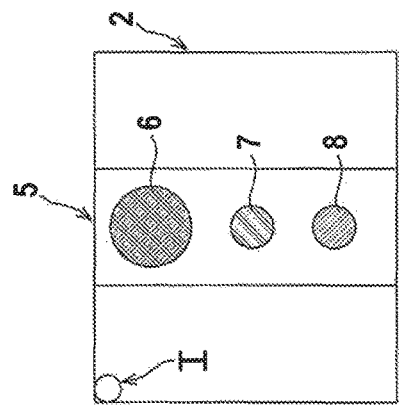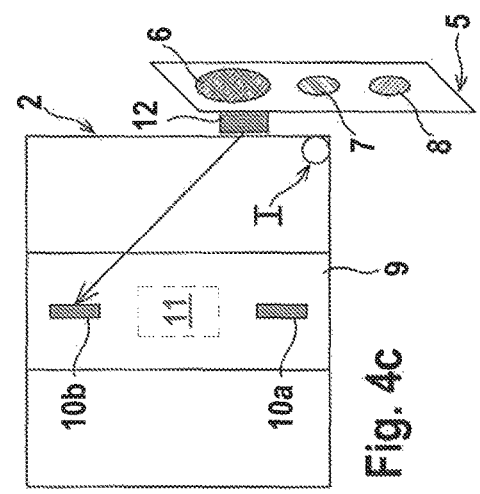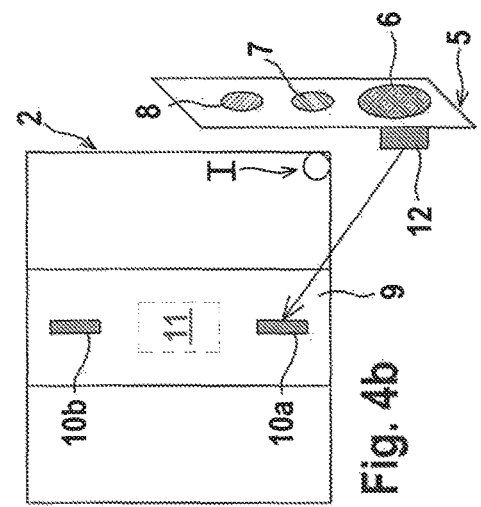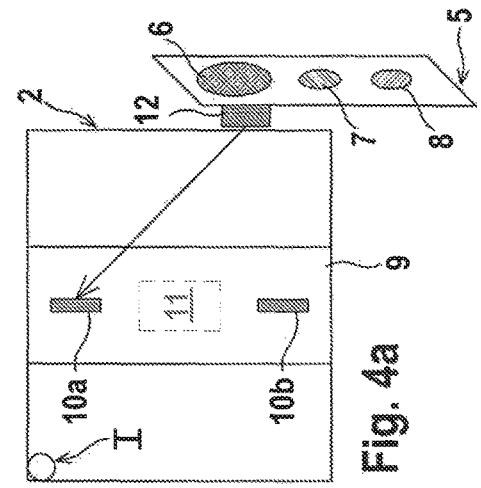

MODULE ARRANGEMENT

CROSS REFERENCE TO RELATED APPLICATIONS

This application claims the priority of DE 102015112990.6 filed on 2015 Aug. 6, this application is incorporated by reference herein in its entirety.

BACKGROUND

The invention relates to a module arrangement.

In general, a module arrangement of this type comprises electronic modules in the form of a base module and one or more submodules that can be put into contact with one another via connection modules in the form of plugs or sockets to form an overall system in that way with a specific functionality.

In particular, module arrangements of this type can constitute safety systems, meaning systems used in the area of safety engineering.

An example of a safety system of that type is a locking safety system.

This locking safety system ensures that movable, separating protective equipment is reliably kept closed, in particular protective doors, and that access is consequently secure to fenced-in, hazardous areas that are critical for safety. The locking safety system is comprised of a locking module on which a handle module is arranged. These modules serve to reliably keep the protective door closed. The door handle of the handle module can be held in the closed position via spring force and unlocked via magnetic force. Alternatively, the door handle can be held in the closed position via magnetic force and unlocked via spring force.

A module arrangement for forming a locking safety system of that type is known from DE 10 2015 101 133.6.

A locking module with a rotationally invariant design of connection modules is provided in this module arrangement so that the locking module can be arranged in the module arrangement in two rotary positions offset by 180°; the handle module of a protective door can be arranged on a choice of the left-hand side or on the right-hand side on the locking module because of this. This locking safety system can therefore be used for correspondingly different protective-door types with handle modules arranged on the right or the left-hand side.

SUMMARY

The invention relates to a module arrangement (1) with a base module and at least one submodule (5); the base module has at least two connection modules. The submodule (5) can be put into contact via a connection module with a choice of one of the connection modules of the base module and can consequently be attached to the base module in different orientations. Detection devices for detecting the orientation of the submodule (5) attached to the base module are provided in the base module.

DETAILED DESCRIPTION

The invention is based on the problem of extending the functionality of a module arrangement of the type mentioned at the outset with little construction effort.

The elements of claim 1 are specified to solve this problem. Advantageous embodiments and useful design developments of the invention are described in the dependent claims.

The invention relates to a module arrangement with a base module and at least one submodule; the base module has at least two connection modules. The submodule can be put into contact via a connection module with a choice of one of the connection modules of the base module and can consequently be attached to the base module in different orientations. Detection devices for detecting the orientation of the submodule attached to the base module are provided in the base module.

A high level of functionality is achieved in the module arrangement as per the invention because the submodule or submodules can be attached to the base module in different orientations, especially in different rotary positions, and form a functional unit there with this base module. The base module itself can be installed in different orientations in a superordinate module structure in the process; the orientation of the submodules on the base module can be suitably selected depending on the orientation of the base module.

If, as an example, a certain absolute orientation of a submodule is required in an application, for instance caused by a series structure of control elements existing on a submodule that is fixed, this requirement for a module arrangement with a base module in different orientations can be realized as per the invention by also adapting the orientation of the submodule on the based module to the orientation of the base module so as to always retain the desired arrangement of the control elements.

An important aspect of the invention is that detection devices are provided in the base module for orientation of the submodule or a submodule on the base module.

As a special advantage, the orientation of the submodule on the base module is determined with the detection devices by detecting the connection modules of the base module that the connection module has been inserted into.

The functionality of the module arrangement is advantageously expanded even further by having the detection devices identify the type of submodule.

The functional reliability of the overall module arrangement is significantly increased by the capability of detecting the orientation and, if necessary, also the type of submodule with the detection devices, because manipulations via an incorrect arrangement of submodules on the base module can be automatically detected.

Suitable countermeasures can be advantageously initiated in an automatic fashion when manipulation of that type is detected. As an example, the operation of the module arrangement can only be enabled when there is no manipulation of that kind.

The functionality of the module arrangement can be expanded in general by having the capability of contact with several submodules on the base module; the base module has at least two connection modules in each case for the connection of each submodule.

It is especially advantageous when separate interface slots with several, preferably two, connection modules are then provided on the base module that a submodule can be brought into contact with in each case in different orientations.

In accordance with a useful design form of the invention, the base module has two connection modules for the connection of the submodule or each submodule to the effect that the submodules can be attached to the base module in two rotary positions that are offset by 180°.

This embodiment can be used in an especially advantageous way for module arrangements in which the base module itself can be used in rotary positions that are rotated by 180° with respect to one another. Depending on the rotational position of the base module, the rotational position of the submodule or each submodule on the base module will be chosen in such a way that arrangements of control elements on the submodule or submodules, as an example, will be invariant in terms of the rotation of the base module.

In accordance with a design form of the invention that is advantageous with regard to its design, the base module has an evaluation electronics unit as a component of the detection devices via which information that is read out of the submodule is evaluated.

A serial interface that is integrated into the connection modules of the base module and of the submodule is advantageously used to input information from a submodule that could be stored in memory elements there.

It is especially advantageous when the rotational position and the submodule type or the type of each submodule arranged on the base module is input and stored in the base module in a learning process.

These values that are input are then used for the operation of the module arrangement and can preferably only be deleted by a factory reset. It is therefore ensured that a configuration of base modules and assigned submodules that has been validly input will be reliably retained.

It is especially advantageous when the module arrangement as per the invention is used in the field of safety engineering as a safety system.

An advantageous possibility for use there consists in having the module arrangement form a locking safety system that has a locking module with a receptacle for a handle module. The handle module can be connected to the locking module with a choice of either a left-hand orientation or a right-hand orientation with respect to the locking module in two different rotational positions of the locking module.

This configuration can consequently be used for protective doors or the like for which the handle module is arranged on either the left-hand side or on the right-hand side of the protective door. Depending on the type of protective door that is used, the locking module will be arranged in the module arrangement in a first rotational position or in a rotational position that is rotated by 180° with regard to it so that a receptacle is arranged on the left-hand side or on the right-hand side of the locking module and can accommodate the respective handle module.

The base module can be formed by an expansion module that can be attached to the locking module in this module arrangement. Alternatively, the base module can constitute the locking module itself.

BRIEF DESCRIPTION OF THE DRAWINGS

The invention will be explained with the aid of the drawings below. The following are shown in the figures:

FIG. 3a-c: Diagrams of a base module with a submodule arranged on it in different rotational positions.

FIG. 4a-c: Diagrams in accordance with FIGS. 3a-c with a submodule detached from the base module.

DETAILED DESCRIPTION OF THE PREFERRED EMBODIMENTS

Figure 1:
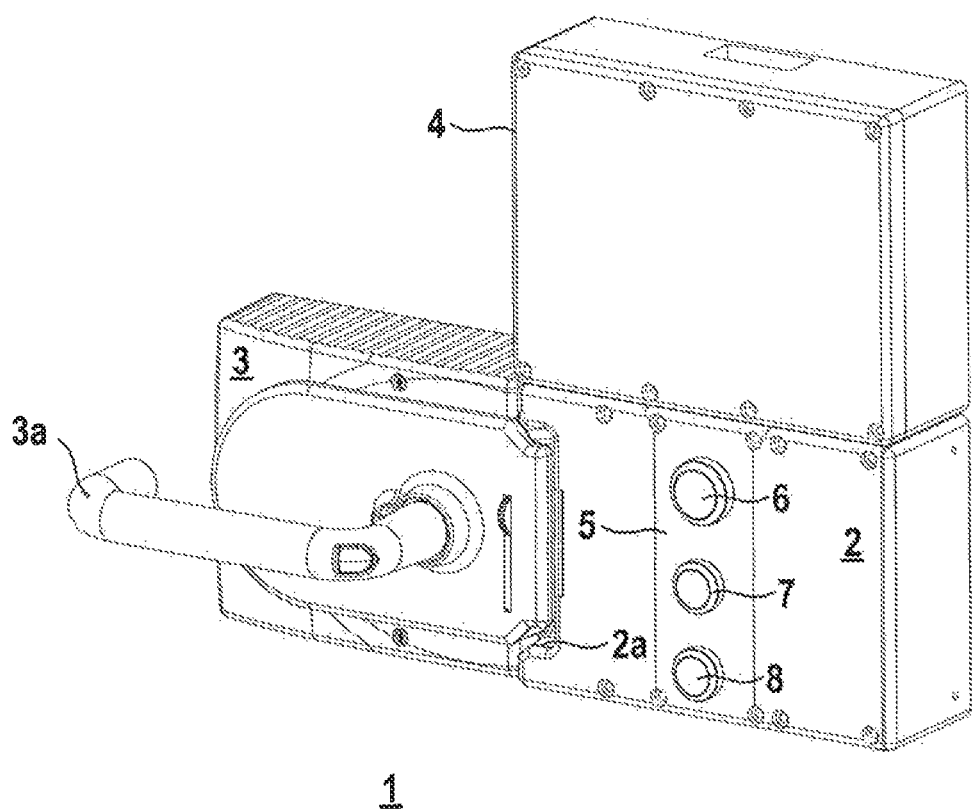
FIG. 1: Example of a module arrangement forming a locking safety system in a first arrangement of modules.
Figure 2:
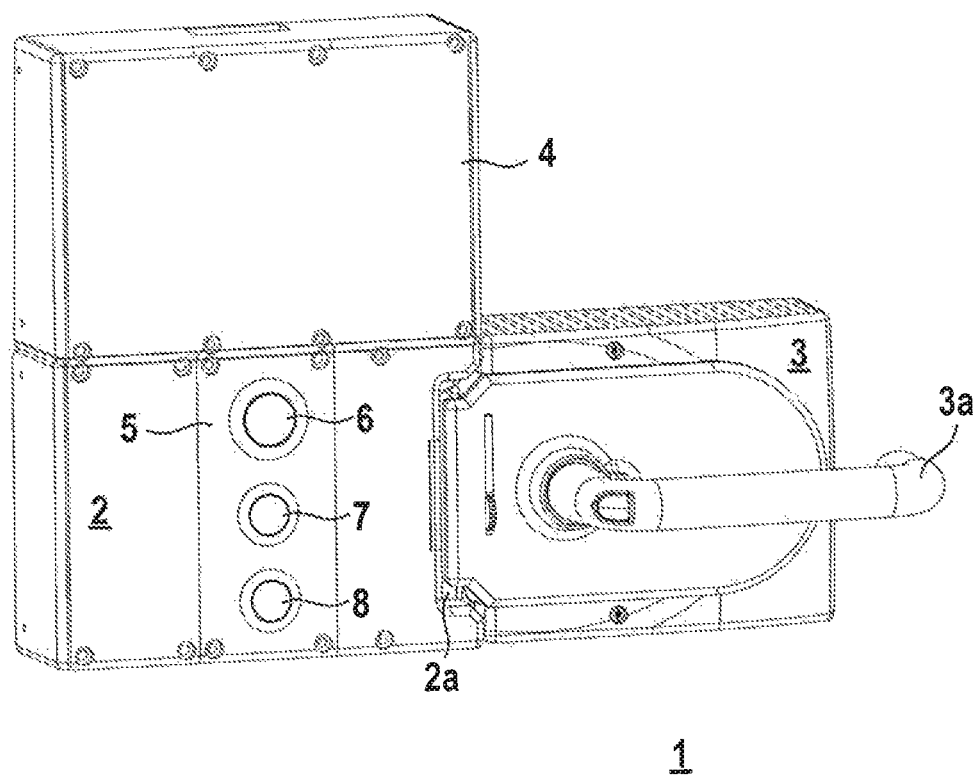
FIG. 2: Module arrangement in accordance with FIG. 1 in a second arrangement of the modules.

FIGS. 1 and 2 show an example of the module arrangement 1 as per the invention in the form of a locking safety system. The locking safety system ensures reliable locking of separating protective equipment, for instance a protective door. The module arrangement 1 comprises a locking module 2 that is arranged in a stationary fashion on a frame or the like, as well as a handle module 3 arranged on the protective door with a door handle 3a that can be moved with the protective door. The locking module 2 has a receptacle 2a into which the handle module 3 is inserted when the protective door is closed. The locking module 2 reliably keeps the protective door closed and consequently brings about protection against a hazardous area on a machine or the like.

As FIGS. 1 and 2 show, the locking module 2 can be used in two rotational positions that are rotated by 180° with respect to one another. In the first rotational position (FIG. 1), the receptacle 2a is on the left-hand side of the locking module 2 so that a handle module 3 arranged on the right-hand side of a protective door can be engaged with the locking module 2. In the second rotational position (FIG. 2), the receptacle 2a is on the right-hand side of the locking module 2 so that a handle module 3 arranged on the right-hand side of a protective door can be engaged with the locking module 2.

An expansion module 4 can be connected to the locking module 2 via connection modules that are not shown to expand the functionality. A submodule 5 is connected to the locking module 2 as the base module. The locking module 2, the expansion module 4 and the submodule 5 are connected via a data bus system.

The submodule 5 is also connected to the locking module 2 in two rotational positions rotated by 180° with respect to one another depending on the direction of rotation of the locking module 2.

The submodule 5 has a series arrangement of control elements, namely an emergency stop button 6 and two buttons 7, 8; their actuation initiates certain functions of the locking safety system. The operation of a machine that is creating a dangerous situation can be stopped with the emergency stop button 6, for instance. Specific operating functions of the locking safety system can be realized with the buttons 7, 8. As shown in FIGS. 1 and 2, the orientation of the control elements is independent of the rotational position of the locking module 2.

FIGS. 3a-c show different rotational positions of the base module, meaning the locking module 2 with submodules 5 arranged on it; the individual rotational positions show the transition from the arrangement in accordance with FIG. 1 to the arrangement in accordance with FIG. 2. FIGS. 4a-c show the same rotational positions as FIGS. 3a-c, but with submodules 5 removed from the base module.

As shown in FIGS. 4a-c, an interface slot 9 is provided on the top surface of the housing of the base module that extends in the form of a strip over the entire length of the housing. Two sockets 10a, 10b with an identical design are arranged on this interface slot 9 as connection modules. The sockets 10a, 10b are arranged at opposite edge areas of the interface slot 9. The longitudinal axes run along a straight line forming the axis of symmetry of the interface slot 9 here. The sockets 10a, 10b are connected to an evaluation electronics unit 11 arranged in the housing of the base module.

The submodule 5 is formed by a flat, rectangular body whose area corresponds to the area of the interface slot 9 of the base module. The control elements, meaning the emergency stop button 6 and the buttons 7, 8, are arranged on the top surface of the submodule 5. A plug 12 juts out as a connection module from the bottom surface of the submodule 5; the plug 12 is arranged in an edge area of the bottom surface of the submodule 5. The plug 12 forms a connection module corresponding to one of the sockets 10a, 10b of the base module, meaning the plug 12 can be inserted into a choice of the sockets 10a, 10b to form an electrical connection between the base module and the submodule 5. The electrical connection is comprised of a serial interface here that is formed by an I²C interface in this case.

Furthermore, the serial interface comprises a communication interface. The type and the orientation of the connection unit are detected via the I²C interface. The communication interface generally serves to exchange data between the connection units.

As an alternative to the embodiment shown in FIGS. 4a-c, the connection modules of the base module can, of course, also be designed as plugs and the connection module of the submodule 5 can be designed as a socket.

Furthermore, a memory element that is not shown, in which data identifying the type is stored, is provided in the submodule 5. The memory element is preferably designed as non-volatile memory. Moreover, an electronic unit, likewise not shown, for driving the control elements and for intake 2a and forwarding of the signals generated by the control elements is provided in the submodule 5.

The individual rotational positions of the base module and of the submodule 5 that are required to turn the arrangement in accordance with FIG. 1 into the arrangement in accordance with FIG. 2 are shown in FIGS. 3a to 3c or 4a to 4c. For the sake of clarity, the rotational position of the base module is identified with a mark I in FIGS. 3a to 3c or 4a to 4c.

FIG. 3a and, analogous to it, 4a, corresponds to the arrangement of the base module and submodule 5 shown in FIG. 1 in which the locking module 2 is oriented in such a way that the receptacle 2a is on the left-hand side in order to accommodate a handle module 3 arranged on the right-hand side of the protective door. The plug 12 of the submodule 5 is in contact with the socket 10a of the base module in this arrangement.

For the conversion to the arrangement in accordance with FIG. 2, in which the locking module 2 is oriented in such a way that the receptacle 2a is on the right-hand side in order to accommodate a handle module 3 arranged on the left-hand side in the protective door, the base module with the submodule 5 arranged on it is first rotated by 180° starting from the arrangement in accordance with FIG. 3a or 4a; the arrangement in accordance with FIG. 3b or 4b is obtained because of that.

After that, the submodule 5 is rotated by 180° relative to the base module with an unchanged rotational position of the base module so that the plug 12 of the submodule 5 makes contact with the socket 10b as shown in FIG. 3c or 4c. That corresponds to the arrangement of FIG. 2.

Because of the rotational capability of the submodule 5 relative to the base module, a situation is achieved in which the control elements of the submodule 5 are arranged in the same way both in the arrangement in accordance with FIG. 1 and in the arrangement in accordance with FIG. 2 such that the emergency stop button 6 is always on top.

The permissible configurations in accordance with FIG. 3a or 3c can be automatically detected in the base module via a detection of the rotational direction of the submodule 5 in the base module. This detection of the rotational direction is carried out by a detection in the evaluation electronics unit 11 as to the socket 10a or 10b that the plug 12 of the submodule 5 is inserted into.

Furthermore, the type of submodule 5 is detected in the evaluation electronics unit 11 with the aid of data read in from the memory element of the submodule 5, so a determination can be made in the base module as to whether a permissible submodule 5 is connected.

In a learning process, the rotational positions of the submodule 5 on the base module and the type of submodule 5 are input and stored in the evaluation electronics unit 11, so permissible configurations of the base module and the submodule 5, as show in the arrangements of FIGS. 1 and 2, for example, are stored in the base module. This configuration can only be deleted with a factory reset. A high level of security against manipulation is therefore obtained with arrangements of this type.

LIST OF REFERENCE NUMERALS (1) Module arrangement
(2) Locking module
(2a) Receptacle
(3) Handle module
(3a) Door handle
(4) Expansion module
(5) Submodule
(6) Emergency stop button
(7) Button
(8) Button
(9) Interface slot
(10a, b) Socket
(11) Evaluation electronics unit
(12) Plug

The invention claimed is:

1. A module arrangement (1) with a base module and at least one submodule (5), characterized in that the base module has at least two connection modules, wherein the submodule (5) can be put into contact via a connection module with a choice of one of the connection modules of the base module and can consequently be attached to the base module in different orientations, wherein detection devices are provided in the base module to detect the orientation of the submodule (5) attached to the base module, and wherein the module arrangement (1) is a locking safety system that includes a locking module (2) as the base module.

2. The module arrangement according to claim 1, characterized in that the orientation of the submodule (5) on the base module is determined with the detection devices by detecting the particular connection module of the base module that the connection module is inserted into.

3. The module arrangement according to claim 1, characterized in that the type of submodule (5) is identified with the detection devices.

4. The module arrangement according to claim 1, characterized in that several submodules (5) can be put into contact with the base module, wherein the base module has at least two connection modules in each case for the connection of each submodule (5).

5. The module arrangement according to claim 1, characterized in that the base module has two connection modules for the connection of the submodule (5) or each submodule to the effect that the submodules (5) can be attached to the base module in two rotational positions offset by 180°.

6. The module arrangement according to claim 1, characterized in that the base module has an evaluation electronics unit (11) as a component of the detection devices via which information read in from a submodule (5) can be evaluated.

7. The module arrangement according to claim 1, characterized in that the connection modules each have a serial interface that is a component of the detection devices.

8. The module arrangement according to claim 1, characterized in that a memory element is provided in each submodule (5) in which information regarding the submodule (5) is stored.

9. The module arrangement according to claim 1, characterized in that the rotational position and the type of the submodule (5) or each submodule arranged on the base module is input into the base module and stored in a learning process.

10. The module arrangement according to claim 9, characterized in that the data of the submodule (5) or each submodule input into the base module can only be deleted with a factory reset or a learning process.

11. The module arrangement according to claim 1, characterized in that it forms a safety system.

12. The module arrangement according to claim 1, characterized in that the locking safety system includes a locking module (2) with a receptacle (2a) for a handle module (3), wherein the handle module (3) can be connected to a choice of the left-hand side or the right-hand side of the locking module in two different rotational positions of the locking module (2).

13. The module arrangement according to claim 12, characterized in that the locking safety system includes a locking module (2), a handle module (3) and an expansion module.

14. The module arrangement according to claim 1, characterized in that the locking safety system further includes an expansion module.

15. A module arrangement (1) with a base module and at least one submodule (5), characterized in that the base module has at least two connection modules, wherein the submodule (5) can be put into contact via a connection module with a choice of one of the connection modules of the base module and can consequently be attached to the base module in different orientations, wherein detection devices are provided in the base module to detect the orientation of the submodule (5) attached to the base module, and wherein the module arrangement (1) is a locking safety system that includes an expansion module as the base module.

* * * * *